(12) United States Patent
Chen

(10) Patent No.: US 11,575,257 B2
(45) Date of Patent: Feb. 7, 2023

(54) MOTOR PROTECTING CIRCUIT

(71) Applicant: ANPEC ELECTRONICS CORPORATION, Hsinchu (TW)

(72) Inventor: Kun-Min Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 37 days.

(21) Appl. No.: 17/406,081

(22) Filed: Aug. 19, 2021

(65) Prior Publication Data
US 2022/0393459 A1   Dec. 8, 2022

(30) Foreign Application Priority Data

Jun. 3, 2021   (TW) ................................. 110120112

(51) Int. Cl.
*H02H 7/09* (2006.01)
*H03K 17/082* (2006.01)
*H02P 1/02* (2006.01)

(52) U.S. Cl.
CPC ............... *H02H 7/09* (2013.01); *H02P 1/021* (2013.01); *H03K 17/0822* (2013.01)

(58) Field of Classification Search
CPC ........... H02H 7/09; H02P 1/021; H02P 29/02; H02M 7/5387; H02M 1/32
See application file for complete search history.

(56) References Cited

U.S. PATENT DOCUMENTS

2008/0304189 A1\* 12/2008  Tang .................... H02H 7/1222
                                                            318/434

\* cited by examiner

*Primary Examiner* — Said Bouziane
(74) *Attorney, Agent, or Firm* — Li & Cai Intellectual Property Office

(57) ABSTRACT

A motor protecting circuit is provided. A first terminal of each of high-side transistors is coupled to a power supply voltage. A second terminal of each of low-side transistors is grounded. Second terminals of the high-side transistors are respectively connected to first terminals of the low-side transistors. An overvoltage detector circuit is coupled to the power supply voltage of an output circuit. When the overvoltage detector circuit determines that the power supply voltage of the output circuit is higher than a voltage threshold, the overvoltage detector circuit outputs an overvoltage detected signal to a controller circuit. According to the overvoltage detected signal, the controller circuit controls a driver circuit to turn on at least one of the high-side transistors and at least one of the low-side transistors at the same time.

16 Claims, 11 Drawing Sheets

MOTOR PROTECTING CIRCUIT

CROSS-REFERENCE TO RELATED PATENT APPLICATION

This application claims the benefit of priority to Taiwan Patent Application No. 110120112, filed on Jun. 3, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a motor, and more particularly to a motor protecting circuit.

BACKGROUND OF THE DISCLOSURE

Circuit components of electronic products produce heat during operation, causing air circulating throughout an enclosed space (especially an enclosed chassis of a server) to be heated up. As a result, other circuit components may be damaged due to overheating. Therefore, fans must be disposed in the electronic products to cool down the circuit components of the electronic products.

A controller circuit of the fan can control a driver circuit to drive a plurality of transistors of a bridge circuit connected to a motor, such that fan blades of the fan rotate with the motor. However, during commutation of the motor, a residual current flows through the transistors of the bridge circuit and parasitic diodes thereof to a power supply voltage source. Therefore, a transient voltage suppressor diode or a Zener diode may be connected between the power supply voltage source and the bridge circuit, thereby preventing the residual current from flowing to the power supply voltage source.

However, due to the configuration of the diode, the residual current only charges an input capacitor such that an inrush voltage of the input capacitor as a power supply voltage is inputted to the bridge circuit. As a result, the transistors of the bridge circuit and other circuit components are damaged, and noise is generated.

SUMMARY OF THE DISCLOSURE

In response to the above-referenced technical inadequacies, the present disclosure provides a motor protecting circuit, which is applicable to a motor. The motor protecting circuit includes a rotor position detector circuit, an output circuit, a driver circuit, a controller circuit and an overvoltage detector circuit. The rotor position detector circuit is disposed on the motor and configured to detect and output a rotor position of the motor. The output circuit includes a plurality of high-side transistors and a plurality of low-side transistors that are respectively classified in a plurality of groups. One of the high-side transistors and one of the low-side transistors are classified in each of the groups. In each of the groups, a first terminal of the high-side transistor is coupled to a power supply voltage, a second terminal of the low-side transistor is grounded, a second terminal of the high-side transistor is connected to a first terminal of the low-side transistor, and a node between the second terminal of the high-side transistor and the first terminal of the low-side transistor is connected to a same one of terminals of the motor. The driver circuit is connected to the output circuit, a control terminal of each of the high-side transistors and a control terminal of each of the low-side transistors. The driver circuit is configured to drive the output circuit. The controller circuit is connected to the driver circuit and the rotor position detector circuit. The controller circuit is configured to control the driver circuit according to the rotor position of the motor that is detected by the rotor position detector circuit. The overvoltage detector circuit is connected to the controller circuit and coupled to the power supply voltage of the output circuit. When the overvoltage detector circuit determines that the power supply voltage of the output circuit is higher than a voltage threshold, the overvoltage detector circuit outputs an overvoltage detected signal to the controller circuit. The controller circuit, according to the overvoltage detected signal, controls the driver circuit to turn on the high-side transistor and the low-side transistor in one of the plurality of groups, or to turn on the high-side transistors and the low-side transistors in some or all of the plurality of groups, at the same time.

In certain embodiments, the overvoltage detector circuit is connected to the driver circuit and configured to output the overvoltage detected signal to the driver circuit. The driver circuit drives the output circuit according to the overvoltage detected signal.

In certain embodiments, the overvoltage detector circuit includes an operational amplifier. A first input terminal of the operational amplifier is coupled to the power supply voltage of the output circuit. A second input terminal of the operational amplifier is coupled to a reference voltage. The operational amplifier outputs the overvoltage detected signal according to the power supply voltage and the reference voltage.

In certain embodiments, the overvoltage detector circuit further includes a voltage divider circuit. The voltage divider circuit is connected between the power supply voltage and the first input terminal of the operational amplifier. The voltage divider circuit divides the power supply voltage to output a divided voltage. The operational amplifier outputs the overvoltage detected signal according to the divided voltage and the reference voltage.

In certain embodiments, the plurality of high-side transistors includes a first high-side transistor and a second high-side transistor. The plurality of low-side transistors includes a first low-side transistor and a second low-side transistor. The first high-side transistor and the first low-side transistor are classified in a same one of the plurality of groups. The second high-side transistor and the second low-side transistor are classified in a same one of the plurality of groups.

In certain embodiments, the output circuit further includes a third high-side transistor and a third low-side transistor, and the third high-side transistor and the third low-side transistor are classified in a same one of the plurality of groups.

In certain embodiments, according to the overvoltage detected signal, the controller circuit controls the driver circuit to fully or slightly turn on the first high-side transistor and to fully or slightly turn on the first low-side transistor at the same time.

In certain embodiments, according to the overvoltage detected signal, the controller circuit controls the driver circuit to fully or slightly turn on the second high-side transistor and to fully or slightly turn on the second low-side transistor at the same time.

In certain embodiments, according to the overvoltage detected signal, the controller circuit controls the driver circuit to fully or slightly turn on the first high-side transistor and the first low-side transistor, and to fully or slightly turn on the second high-side transistor and the second low-side transistor, at the same time.

In certain embodiments, the controller circuit controls the driver circuit to fully turn on the third high-side transistor and the third low-side transistor at the same time according to the overvoltage detected signal.

In certain embodiments, according to the overvoltage detected signal, the controller circuit controls the driver circuit to fully turn on the third high-side transistor, and regulate the third low-side transistor to be slightly turned on, at the same time.

In certain embodiments, according to the overvoltage detected signal, the controller circuit controls the driver circuit to regulate the third high-side transistor to slightly turn on the third high-side transistor, and to fully turn on the third low-side transistor, at the same time.

In certain embodiments, the motor is a single-phase motor or a three-phase motor.

As described above, the present disclosure provides the motor protecting circuit. When the power supply voltage is higher than the voltage threshold, the high-side transistor and the low-side transistor in one of the plurality of groups or the high-side transistors and the low-side transistors in all or some of the plurality of groups are turned on. As a result, a current flows to the ground but not to the power supply voltage, thereby preventing the high-side transistors and the low-side transistors from being damaged due to overvoltage.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
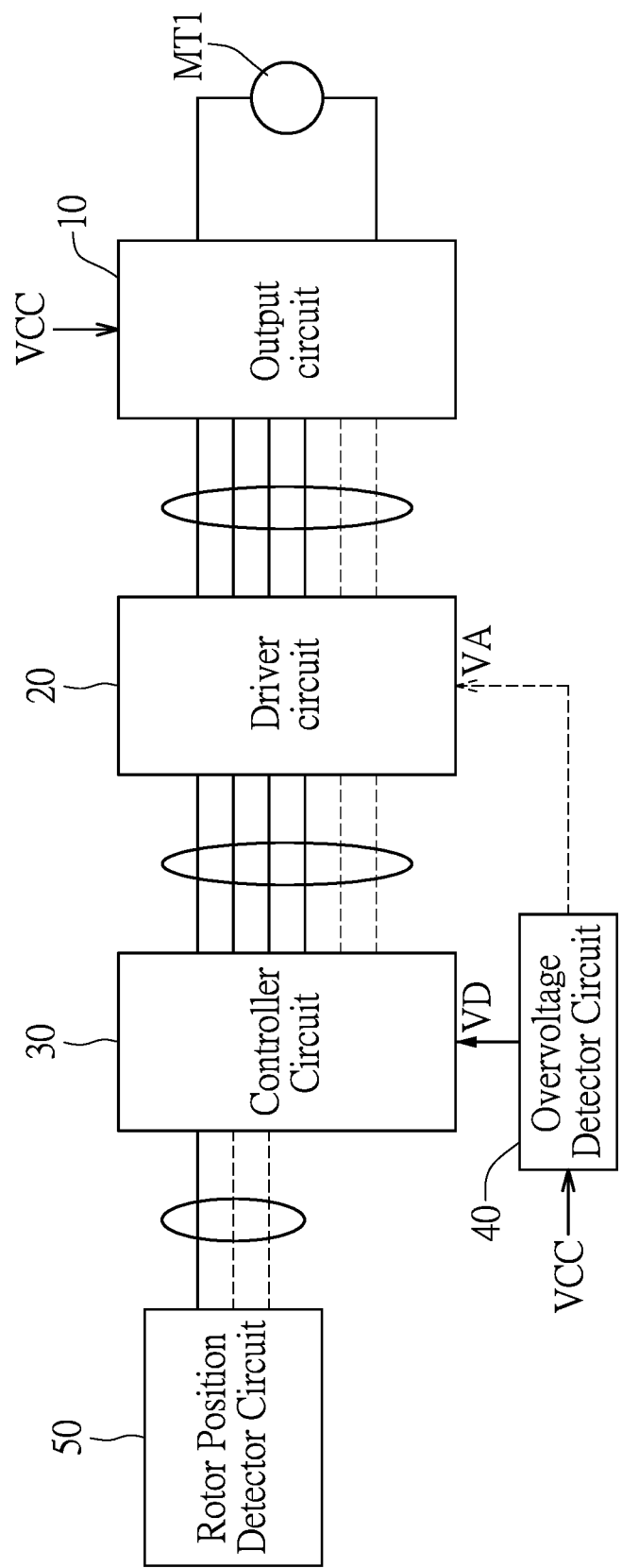
FIG. 1 is a block diagram of a motor protecting circuit according to first to fourteenth embodiments of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a block diagram of a motor protecting circuit according to first to fourteen embodiments of the present disclosure.

As shown in FIG. 1, in the embodiment, the motor protecting circuit may include an output circuit 10, a driver circuit 20, a controller circuit 30, an overvoltage detector circuit 40 and a rotor position detector circuit 50.

For the convenience of explanation, each of a plurality of high-side transistors and a plurality of low-side transistors is classified in one of a plurality of groups. One of the high-side transistors and one of the low-side transistors are classified in each of the groups. That is, a first high-side transistor H1 and a first low-side transistor L1 are classified in a same one of the plurality of groups. A second high-side transistor H2 and a second low-side transistor L2 are classified in a same one of the plurality of groups. A third high-side transistor H3 and a third low-side transistor L3 are classified in a same one of the plurality of groups. In each of the groups, a second terminal of the high-side transistor is connected to a first terminal of the low-side transistor, a node between the second terminal of the high-side transistor and the first terminal of the low-side transistor is connected to a same one of terminals of the motor, and a control terminal of the high-side transistor and a control terminal of the low-side transistor are connected to the driver circuit 20.

The rotor position detector circuit 50 may be disposed on a motor 90 and connected to the controller circuit 30. The rotor position detector circuit 50 may detect a rotor position of the motor 90 and output the detected rotor position of the motor 90 to the controller circuit 30.

The driver circuit 20 may be connected to the controller circuit 30 and the output circuit 10. The output circuit 10 may be connected to the motor 90. The controller circuit 30 may control the driver circuit 20 to drive the output circuit 10 according to the rotor position of the motor that is currently detected by the rotor position detector circuit 50.

The output circuit 10 may include the plurality of high-side transistors and the plurality of low-side transistors. A first terminal of each of the high-side transistors is coupled to a power supply voltage VCC. A second terminal of each of the low-side transistors is grounded.

The overvoltage detector circuit 40 may be connected to the controller circuit 30 and coupled to the power supply voltage VCC of the output circuit 10.

It is worth noting that, the overvoltage detector circuit 40 is configured to determine whether or not the power supply voltage VCC of the output circuit 10 is higher than a voltage threshold. When the overvoltage detector circuit 40 determines that the power supply voltage VCC of the output circuit 10 is higher than the voltage threshold, the overvoltage detector circuit 40 outputs an overvoltage detected signal VD to the controller circuit 30. When the controller circuit 30 determines that there is an overvoltage event, in which the power supply voltage VCC exceeds the voltage threshold, according to the overvoltage detected signal VD, the controller circuit 30 controls the driver circuit 20 to turn on the high-side transistor and the low-side transistor in one of the plurality of groups or to turn on the high-side transistors and the low-side transistors in some or all of the plurality of groups at the same time.

If necessary, the overvoltage detector circuit 40 may be connected to the driver circuit 20. When the overvoltage detector circuit 40 determines that the power supply voltage VCC is higher than the voltage threshold, the overvoltage detector circuit 40 outputs an overvoltage detected signal VA to the driver circuit 20. According to the overvoltage detected signal VA, the driver circuit 20 may turn on the high-side transistor and the low-side transistor in one of the plurality of groups or turn on the high-side transistors and the low-side transistors in some or all of the plurality of groups at the same time.

That is, when the overvoltage event occurs, in which the power supply voltage VCC exceeds the voltage threshold, the high-side transistor and the low-side transistor in at least one of the groups are turned on such that a current flows to a ground GND, thereby preventing the current from flowing to the power supply voltage VCC. The high-side transistor and the low-side transistor in one of the groups are turned on or the high-side transistors and the low-side transistors in more than one of the groups are turned on in the following second to fourteenth embodiments, but the present disclosure is not limited thereto.

Figure 2:
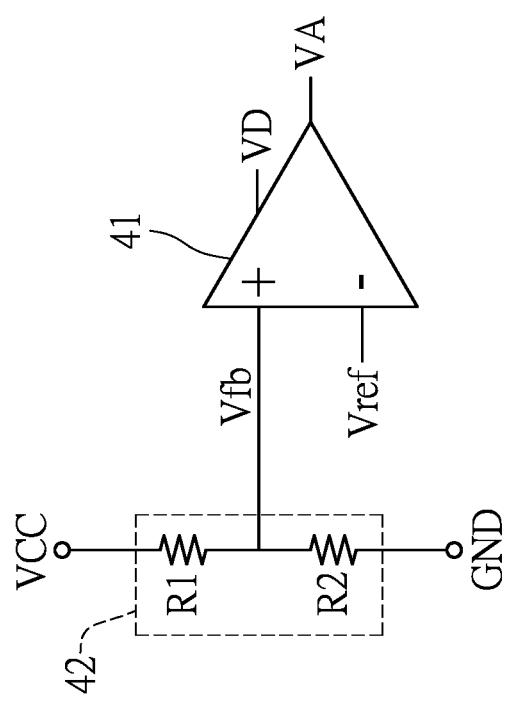
FIG. 2 is a circuit layout diagram of an overvoltage detector circuit of the motor protecting circuit according to the first embodiment of the present disclosure.

Reference is made to FIG. 2, which is a circuit layout diagram of an overvoltage detector circuit of the motor protecting circuit according to the first embodiment of the present disclosure.

The overvoltage detector circuit of the motor protecting circuit (such as the overvoltage detector circuit 40 shown in FIG. 1) may only include an operational amplifier 41 shown in FIG. 2.

A first input terminal (such as a non-inverting input terminal) of the operational amplifier 41 may be directly coupled to the power supply voltage VCC of the output circuit 10. A second input terminal (such as an inverting input terminal) of the operational amplifier 41 may be coupled to a reference voltage Vref. The operational amplifier 41 multiplies a difference between the power supply voltage VCC and the reference voltage Vref by a gain to output the overvoltage detected signal VD to the controller circuit 30 or output the overvoltage detected signal VA to the driver circuit 20.

Alternatively, as shown in FIG. 2, the overvoltage detector circuit of the motor protecting circuit (such as the overvoltage detector circuit 40 shown in FIG. 1) may further include a voltage divider 42. The voltage divider 42 may be configured to divide the power supply voltage VCC to output a divided voltage Vfb (that is, a voltage of a second resistor R2 that will be described below).

In detail, the voltage divider 42 may include a first resistor R1 and the second resistor R2. A first terminal of the first resistor R1 is coupled to the power supply voltage VCC of the output circuit 10. A second terminal of the first resistor R1 is connected to a first terminal of the second resistor R2. A second terminal of the second resistor R2 is grounded. A voltage dividing node between the second terminal of the first resistor R1 and the first terminal of the second resistor R2 is connected to the first input terminal (such as the non-inverting input terminal) of the operational amplifier 41. The second input terminal (such as the inverting input terminal) of the operational amplifier 41 is coupled to the reference voltage Vref.

The operational amplifier 41 multiplies a difference between the divided voltage Vfb (that is, the voltage of the second resistor R2) and the reference voltage Vref by the gain to output the overvoltage detected signal VD to the controller circuit 30 or output the overvoltage detected signal VA to the driver circuit 20.

Figure 3:
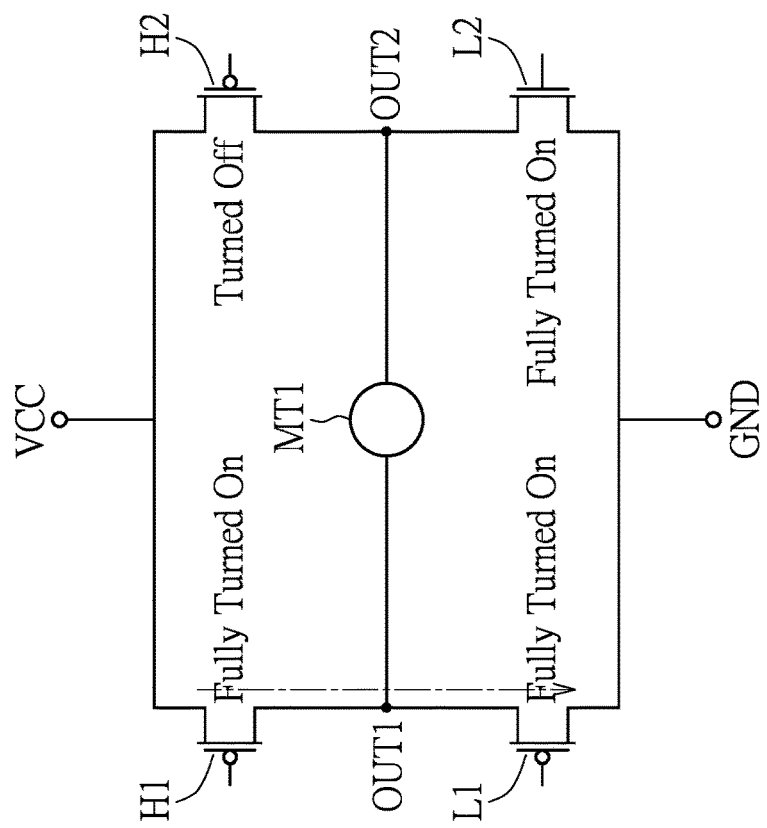
FIG. 3 is a circuit layout diagram of an output circuit of the motor protecting circuit according to the second embodiment of the present disclosure.

Reference is made to FIGS. 1 and 3, in which FIG. 1 is the block diagram of the motor protecting circuit according to the first to the fourteenth embodiments of the present disclosure, and FIG. 3 is a circuit layout diagram of an output circuit of the motor protecting circuit according to the second embodiment of the present disclosure.

The motor protecting circuit of the embodiment is applied to a motor MT1 that is a single-phase motor. The output circuit 10 shown in FIG. 1 may include the first high-side transistor H1, the first low-side transistor L1, the second high-side transistor H2 and the second low-side transistor L2.

For example, the first high-side transistor H1 and the second high-side transistor H2 may be p-channel metal oxide semiconductor field effect transistors (PMOSs), and the first low-side transistor L1 and the second low-side transistor L2 may be n-channel metal oxide semiconductor field effect transistors (NMOSs), but the present disclosure is not limited thereto. It should be understood that, different types of transistors may be disposed in the output circuit 10 according to actual requirements.

A first terminal of the first high-side transistor H1 is coupled to the power supply voltage VCC. A second terminal of the first high-side transistor H1 is connected to a first terminal of the first low-side transistor L1. A node between the second terminal of the first high-side transistor H1 and the first terminal of the first low-side transistor L1 is connected to a first terminal OUT1 of the motor MT1. A second terminal of the first low-side transistor L1 is grounded. A control terminal of the first high-side transistor H1 and a control terminal of the second low-side transistor L1 are connected to the driver circuit 20.

A first terminal of the second high-side transistor H2 is coupled to the power supply voltage VCC. A second terminal of the second high-side transistor H2 is connected to a first terminal of the second low-side transistor L2. A node between the second terminal of the second high-side transistor H2 and the first terminal of the second low-side transistor L2 is connected to a second terminal OUT2 of the motor MT1. A second terminal of the second low-side transistor L2 is grounded. A control terminal of the second high-side transistor H2 and a control terminal of the second low-side transistor L2 are connected to the driver circuit 20.

Before the power supply voltage VCC is higher than the voltage threshold, the controller circuit 30 may control the driver circuit 20 to fully turn on the first high-side transistor H1 and the second low-side transistor L2, and to turn off the first low-side transistor L1 and the second high-side transistor H2 at the same time.

It is worth noting that, when the overvoltage detector circuit 40 determines that the power supply voltage VCC is higher than the voltage threshold, the controller circuit 30 may control the driver circuit 20 to fully turn on the first low-side transistor L1, to still fully turn on the first high-side transistor H1 and the second low-side transistor L2, and to still turn off the second high-side transistor H2, as shown in FIG. 3.

As a result, a current flows to the ground GND sequentially through the first high-side transistor H1 and the first low-side transistor L1, but does not flow to the power supply voltage VCC, thereby preventing the output circuit 10 from being damaged due to overvoltage (in which the power supply voltage VCC exceeds the voltage threshold). After the current flowing through the output circuit 10 is reduced, the controller circuit 30 may control the driver circuit 20 to switch the output circuit 10.

Figure 4:
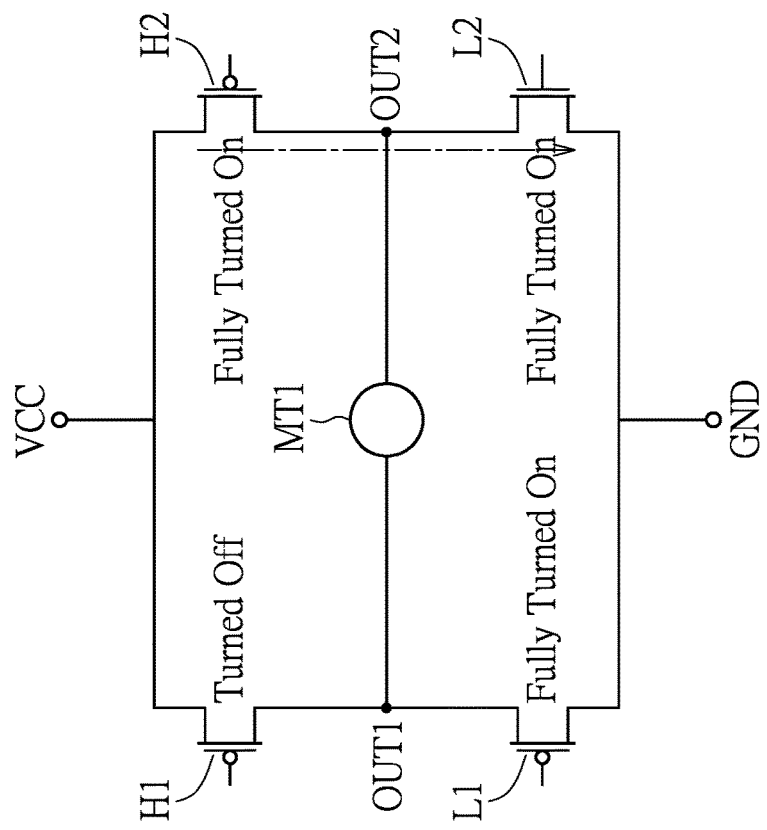
FIG. 4 is a circuit layout diagram of an output circuit of the motor protecting circuit according to the third embodiment of the present disclosure.

Reference is made to FIGS. 1 and 4, in which FIG. 1 is a block diagram of a motor protecting circuit according to first to fourteen embodiments of the present disclosure, and FIG. 4 is a circuit layout diagram of an output circuit of the motor protecting circuit according to the third embodiment of the present disclosure. The same descriptions are not repeated herein.

Before the power supply voltage VCC is higher than the voltage threshold, the controller circuit 30 may control the driver circuit 20 to fully turn on the first low-side transistor L1 and the second high-side transistor H2, and to turn off the first high-side transistor H1 and the second low-side transistor L2 at the same time.

It is worth noting that, when the overvoltage detector circuit 40 determines that the power supply voltage VCC is higher than the voltage threshold, the controller circuit 30 may control the driver circuit 20 to fully turn on the second low-side transistor L2, to still fully turn on the first low-side transistor L1 and the second high-side transistor H2, and to still turn off the first high-side transistor H1 at the same time, as shown in FIG. 4.

As a result, a current flows to the ground GND sequentially through the second high-side transistor H2 and the second low-side transistor L2.

Figure 5:
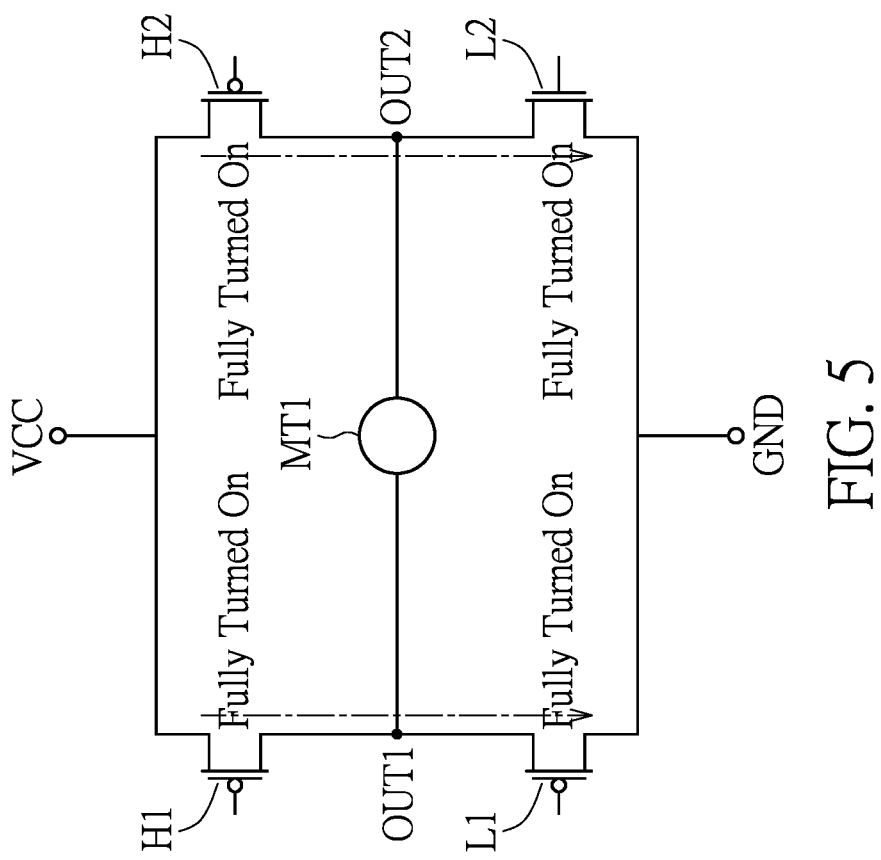
FIG. 5 is a circuit layout diagram of an output circuit of the motor protecting circuit according to the fourth embodiment of the present disclosure.

Reference is made to FIGS. 1 and 5, in which FIG. 1 is a block diagram of a motor protecting circuit according to first to fourteen embodiments of the present disclosure, and FIG. 5 is a circuit layout diagram of an output circuit of the motor protecting circuit according to the fourth embodiment of the present disclosure. The same descriptions are not repeated herein.

Before the power supply voltage VCC is higher than the voltage threshold, the controller circuit 30 may control the driver circuit 20 to fully turn on the first high-side transistor H1 and the second low-side transistor L2, and to turn off the first low-side transistor L1 and the second high-side transistor H2 at the same time. It is worth noting that, when the overvoltage detector circuit 40 determines that the power supply voltage VCC is higher than the voltage threshold, the controller circuit 30 may control the driver circuit 20 to fully turn on the first low-side transistor L1 and the second high-side transistor H2, and to still fully turn on the first high-side transistor H1 and the second low-side transistor L2 at the same time, as shown in FIG. 5.

In practice, before the power supply voltage VCC is higher than the voltage threshold, the controller circuit 30 may control the driver circuit 20 to fully turn on the first low-side transistor L1 and the second high-side transistor H2, and to turn off the first high-side transistor H1 and the second low-side transistor L2 at the same time. Then, when the overvoltage detector circuit 40 determines that the power supply voltage VCC is higher than the voltage threshold, the controller circuit 30 may control the driver circuit 20 to fully turn on the first high-side transistor H1 and the second low-side transistor L2, and to turn off the first low-side transistor L1 and the second high-side transistor H2 at the same time.

As a result, one current flows to the ground GND sequentially through the first high-side transistor H1 and the first low-side transistor L1, and another current flows to the ground GND sequentially through the second high-side transistor H2 and the second low-side transistor L2.

In this way, the current does not flow to the power supply voltage VCC and charge the power supply voltage VCC, thereby preventing the output circuit 10 from being damaged due to overvoltage. After the current flowing through the output circuit 10 is reduced, the controller circuit 30 may control the driver circuit 20 to switch the output circuit 10.

Figure 6:
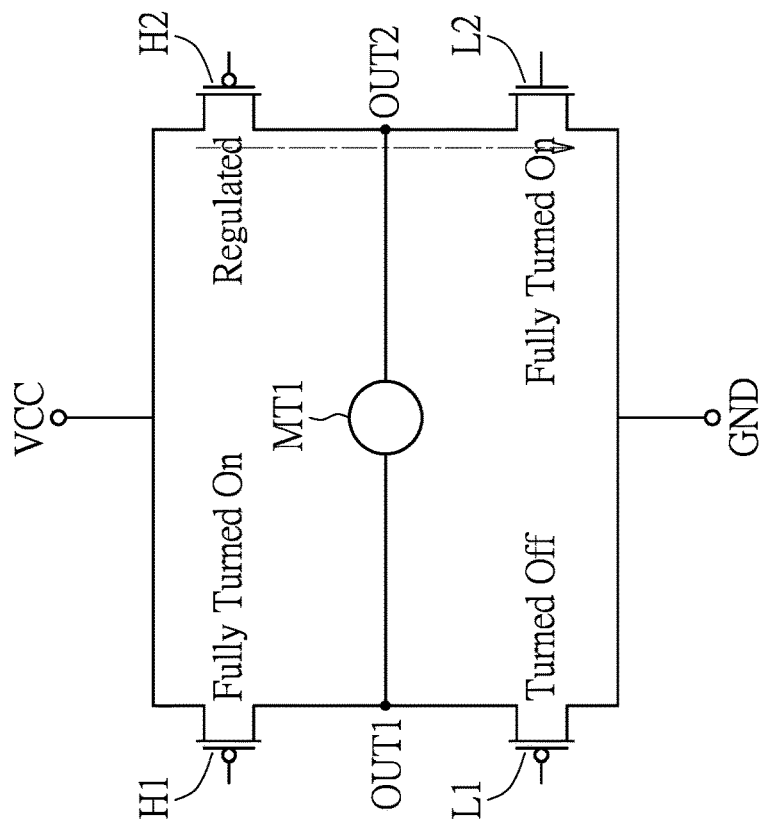
FIG. 6 is a circuit layout diagram of an output circuit of the motor protecting circuit according to the fifth embodiment of the present disclosure.

Reference is made to FIGS. 1 and 6, in which FIG. 1 is a block diagram of a motor protecting circuit according to first to fourteen embodiments of the present disclosure, and FIG. 6 is a circuit layout diagram of an output circuit of the motor protecting circuit according to the fifth embodiment of the present disclosure. The same descriptions are not repeated herein.

Before the power supply voltage VCC is higher than the voltage threshold, the controller circuit 30 may control the driver circuit 20 to fully turn on the first high-side transistor H1 and the second low-side transistor L2, and to turn off the first low-side transistor L1 and the second high-side transistor H2 at the same time.

It is worth noting that, when the overvoltage detector circuit 40 determines that the power supply voltage VCC is higher than the voltage threshold, the controller circuit 30 may control the driver circuit 20 to regulate the second high-side transistor H2 to be slightly turned on, to still fully turn on the first high-side transistor H1 and the second low-side transistor L2, and to still turn off the first low-side transistor L1 at the same time, as shown in FIG. 6.

As a result, a current slowly flows through the second high-side transistor H2, then flows through the second low-side transistor L2, and finally flows to the ground GND.

Figure 7:
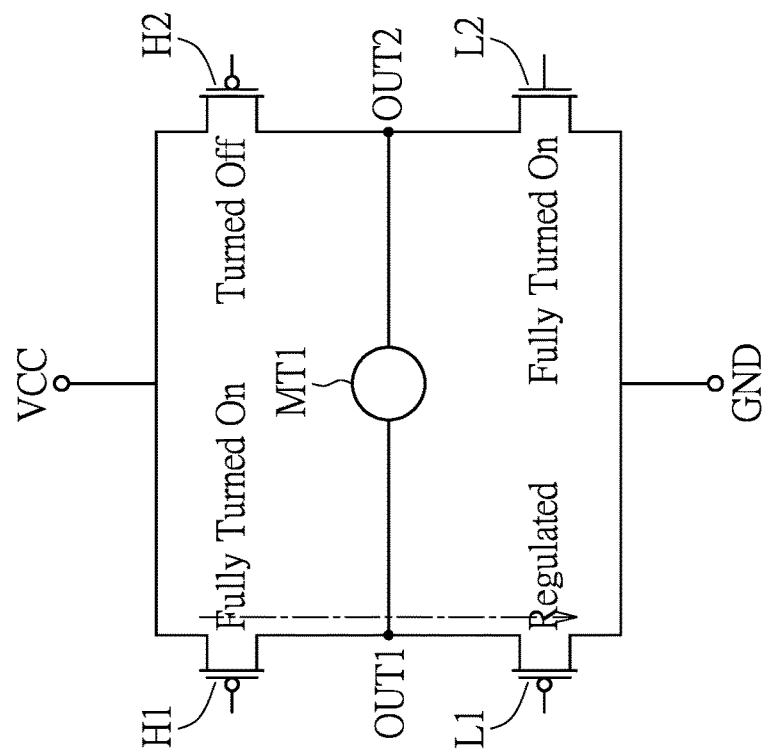
FIG. 7 is a circuit layout diagram of an output circuit of the motor protecting circuit according to the sixth embodiment of the present disclosure.

Reference is made to FIGS. 1 and 7, in which FIG. 1 is a block diagram of a motor protecting circuit according to first to fourteen embodiments of the present disclosure, and FIG. 7 is a circuit layout diagram of an output circuit of the motor protecting circuit according to the sixth embodiment of the present disclosure. The same descriptions are not repeated herein.

Before the power supply voltage VCC is higher than the voltage threshold, the controller circuit 30 may control the driver circuit 20 to fully turn on the first high-side transistor H1 and the second low-side transistor L2, and to turn off the first low-side transistor L1 and the second high-side transistor H2 at the same time.

It is worth noting that, when the overvoltage detector circuit 40 determines that the power supply voltage VCC is higher than the voltage threshold, the controller circuit 30 may control the driver circuit 20 to regulate the first low-side transistor L1 to be slightly turned on, to still fully turn on the first high-side transistor H1 and the second low-side transistor L2, and to still turn off the second high-side transistor H2 at the same time, as shown in FIG. 7.

As a result, a current flows to the second high-side transistor H2, then slowly flows through the second low-side transistor L2, and finally flows to the ground GND.

Figure 8:
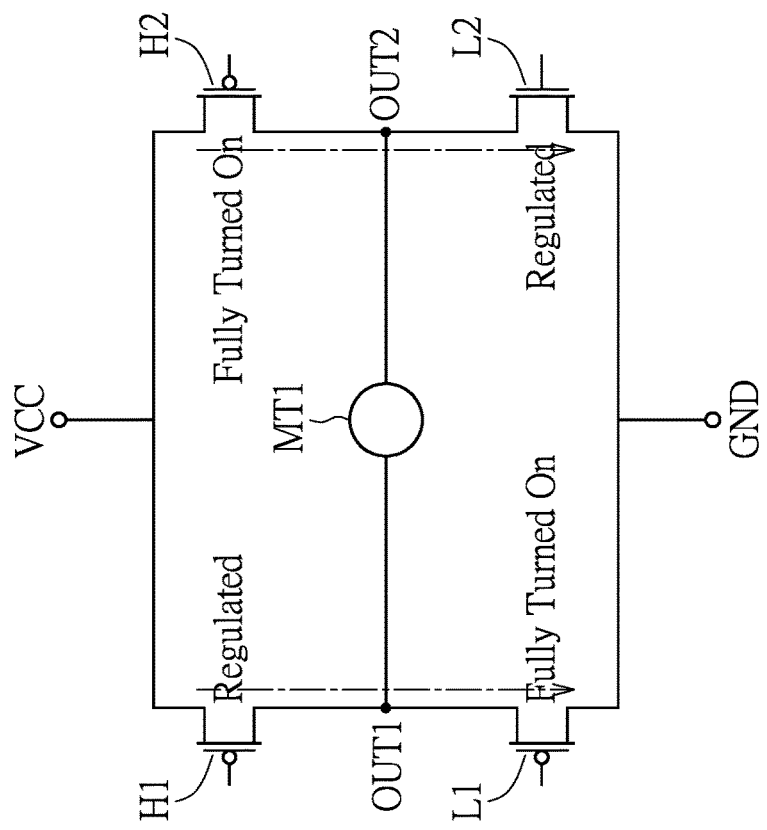
FIG. 8 is a circuit layout diagram of an output circuit of the motor protecting circuit according to the seventh embodiment of the present disclosure.

Reference is made to FIGS. 1 and 8, in which FIG. 1 is a block diagram of a motor protecting circuit according to first to fourteen embodiments of the present disclosure, and FIG. 8 is a circuit layout diagram of an output circuit of the motor protecting circuit according to the seventh embodiment of the present disclosure. The same descriptions are not repeated herein.

Before the power supply voltage VCC is higher than the voltage threshold, the controller circuit 30 may control the driver circuit 20 to fully turn on the first high-side transistor H1 and the second low-side transistor L2, and to turn off the first low-side transistor L1 and the second high-side transistor H2 at the same time.

It is worth noting that, when the overvoltage detector circuit 40 determines that the power supply voltage VCC is higher than the voltage threshold, the controller circuit 30 may control the driver circuit 20 to regulate the first low-side transistor L1 and the second high-side transistor H2 to be slightly turned on, and to still fully turn on the first high-side transistor H1 and the second low-side transistor L2 at the same time, as shown in FIG. 8.

As a result, one current flows to the first high-side transistor H1, then slowly flows through the first low-side transistor L1, and finally flows to the ground GND. Another current slowly flows through the second high-side transistor H2, then flows through the second low-side transistor L2, and finally flows to the ground GND.

Figure 9:
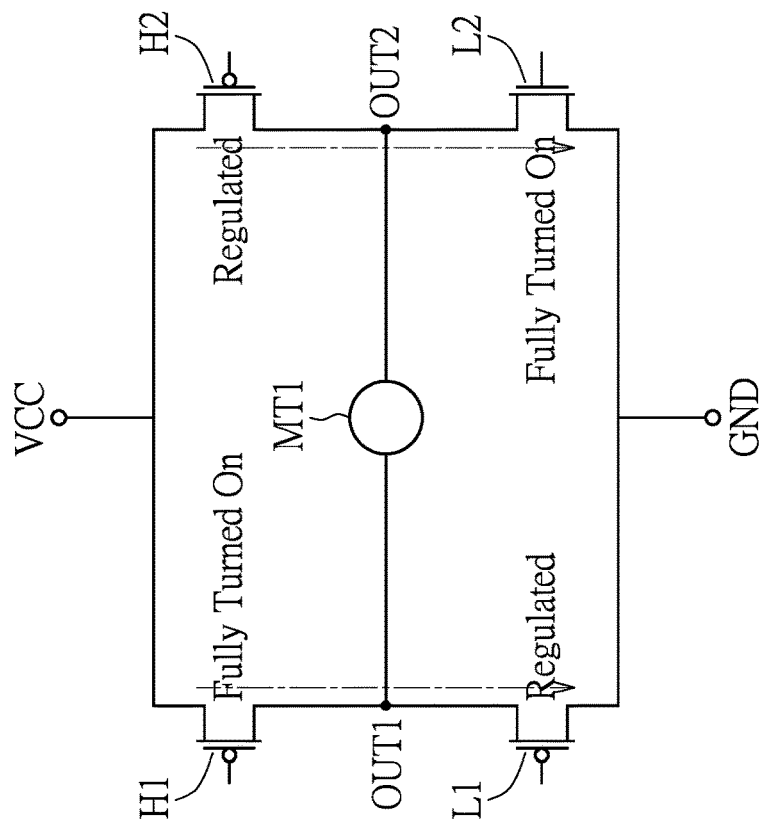
FIG. 9 is a circuit layout diagram of an output circuit of the motor protecting circuit according to the eighth embodiment of the present disclosure.

Reference is made to FIGS. 1 and 9, in which FIG. 1 is a block diagram of a motor protecting circuit according to first to fourteen embodiments of the present disclosure, and FIG. 9 is a circuit layout diagram of an output circuit of the motor protecting circuit according to the eighth embodiment of the present disclosure. The same descriptions are not repeated herein.

Before the power supply voltage VCC is higher than the voltage threshold, the controller circuit 30 may control the driver circuit 20 to fully turn on the first low-side transistor L1 and the second high-side transistor H2, and to turn off the first high-side transistor H1 and the second low-side transistor L2.

It is worth noting that, when the overvoltage detector circuit 40 determines that the power supply voltage VCC is higher than the voltage threshold, the controller circuit 30 may control the driver circuit 20 to regulate the first high-side transistor H1 and the second low-side transistor L2 to be slightly turned on, and to still fully turn on the first low-side transistor L1 and the second high-side transistor H2 at the same time, as shown in FIG. 9.

As a result, one current slowly flows to the first high-side transistor H1, then flows through the first low-side transistor L1, and finally flows to the ground GND. Another current flows through the second high-side transistor H2, then slowly flows through the second low-side transistor L2, and finally flows to the ground GND.

Figure 10:
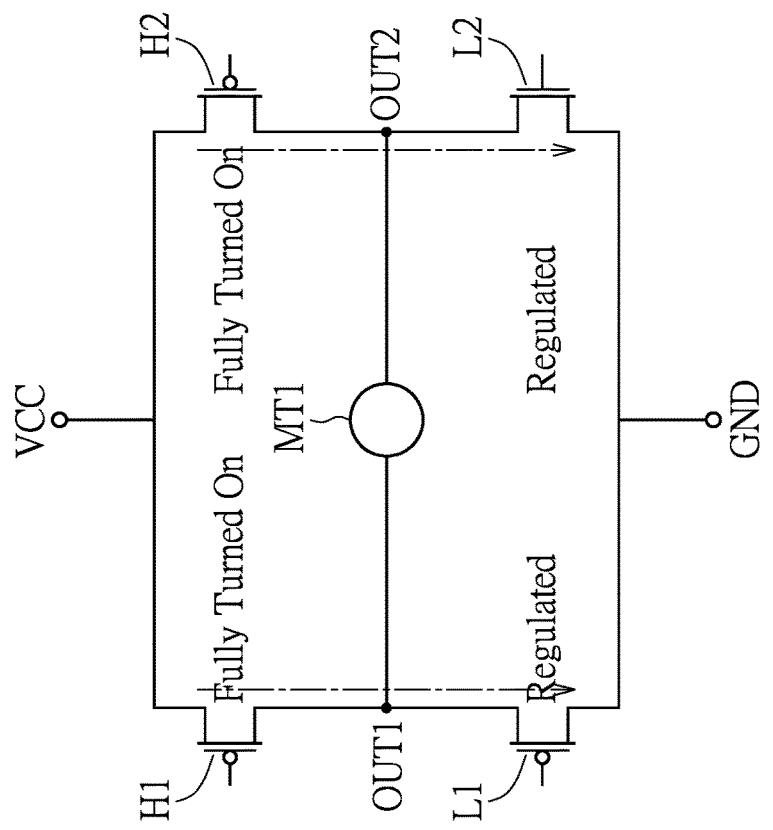
FIG. 10 is a circuit layout diagram of an output circuit of the motor protecting circuit according to the ninth embodiment of the present disclosure.

Reference is made to FIGS. 1 and 10, in which FIG. 1 is a block diagram of a motor protecting circuit according to first to fourteen embodiments of the present disclosure, and FIG. 10 is a circuit layout diagram of an output circuit of the motor protecting circuit according to the ninth embodiment of the present disclosure. The same descriptions are not repeated herein.

When the overvoltage detector circuit 40 determines that the power supply voltage VCC is higher than the voltage threshold, the controller circuit 30 may control the driver circuit 20 to regulate the first high-side transistor H1 and the second high-side transistor H2 to be slightly turned on, and to fully turn on the first low-side transistor L1 and the second low-side transistor L2 at the same time, as shown in FIG. 10.

As a result, one current slowly flows to the first high-side transistor H1, then flows to the first low-side transistor L1, and finally flows to the ground GND. Another current slowly flows through the second high-side transistor H2, then flows to the second low-side transistor L2, and finally flows to the ground GND.

Figure 11:
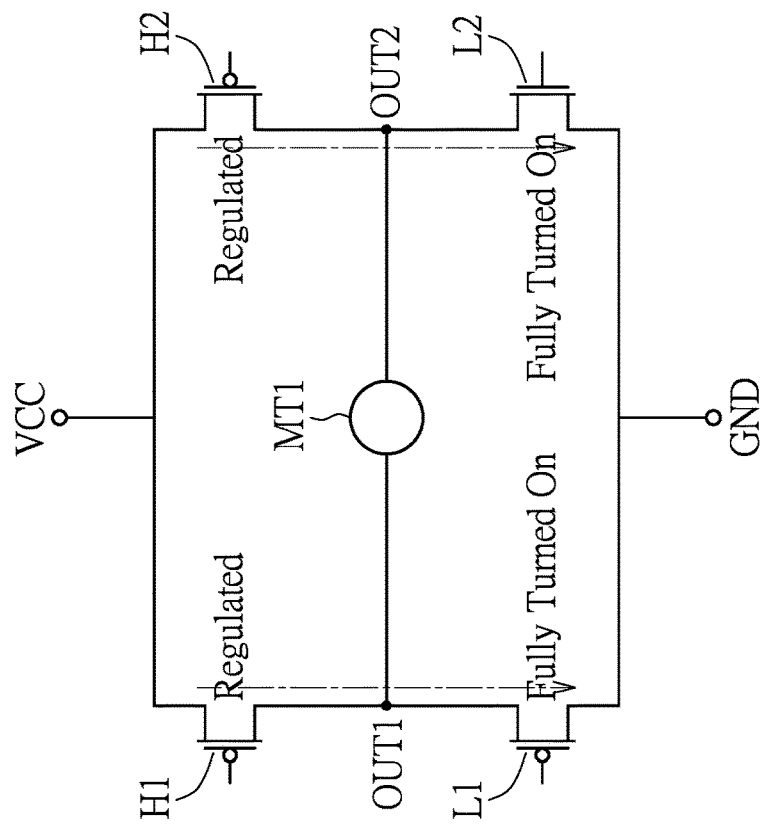
FIG. 11 is a circuit layout diagram of an output circuit of the motor protecting circuit according to the tenth embodiment of the present disclosure.

Reference is made to FIGS. 1 and 11, in which FIG. 1 is a block diagram of a motor protecting circuit according to first to fourteen embodiments of the present disclosure, and FIG. 11 is a circuit layout diagram of an output circuit of the motor protecting circuit according to the tenth embodiment of the present disclosure. The same descriptions are not repeated herein.

When the overvoltage detector circuit 40 determines that the power supply voltage VCC is higher than the voltage threshold, the controller circuit 30 may control the driver circuit 20 to regulate the first low-side transistor L1 and the second low-side transistor L2 to be slightly turned on, and to fully turn on the first high-side transistor H1 and the second high-side transistor H2 at the same time, as shown in FIG. 11.

As a result, one current flows through the first high-side transistor H1, then slowly flows through the first low-side transistor L1, and finally flows to the ground GND. Another current flows through the second high-side transistor H2, then slowly flows to the second low-side transistor L2, and finally flows to the ground GND.

In the second to the tenth embodiments, the motor protecting circuit is applied to the single-phase motor, but may be applied to a three-phase motor in practice. If the motor protecting circuit is applied to the three-phase motor, operations mentioned in any one of the second to the tenth embodiment may be carried out by the first high-side transistor H1, the first low-side transistor L1, the second high-side transistor H2 and the second low-side transistor L2. A third high-side transistor H3 and a third low-side transistor L3 will be illustrated in the following description.

Figure 12:
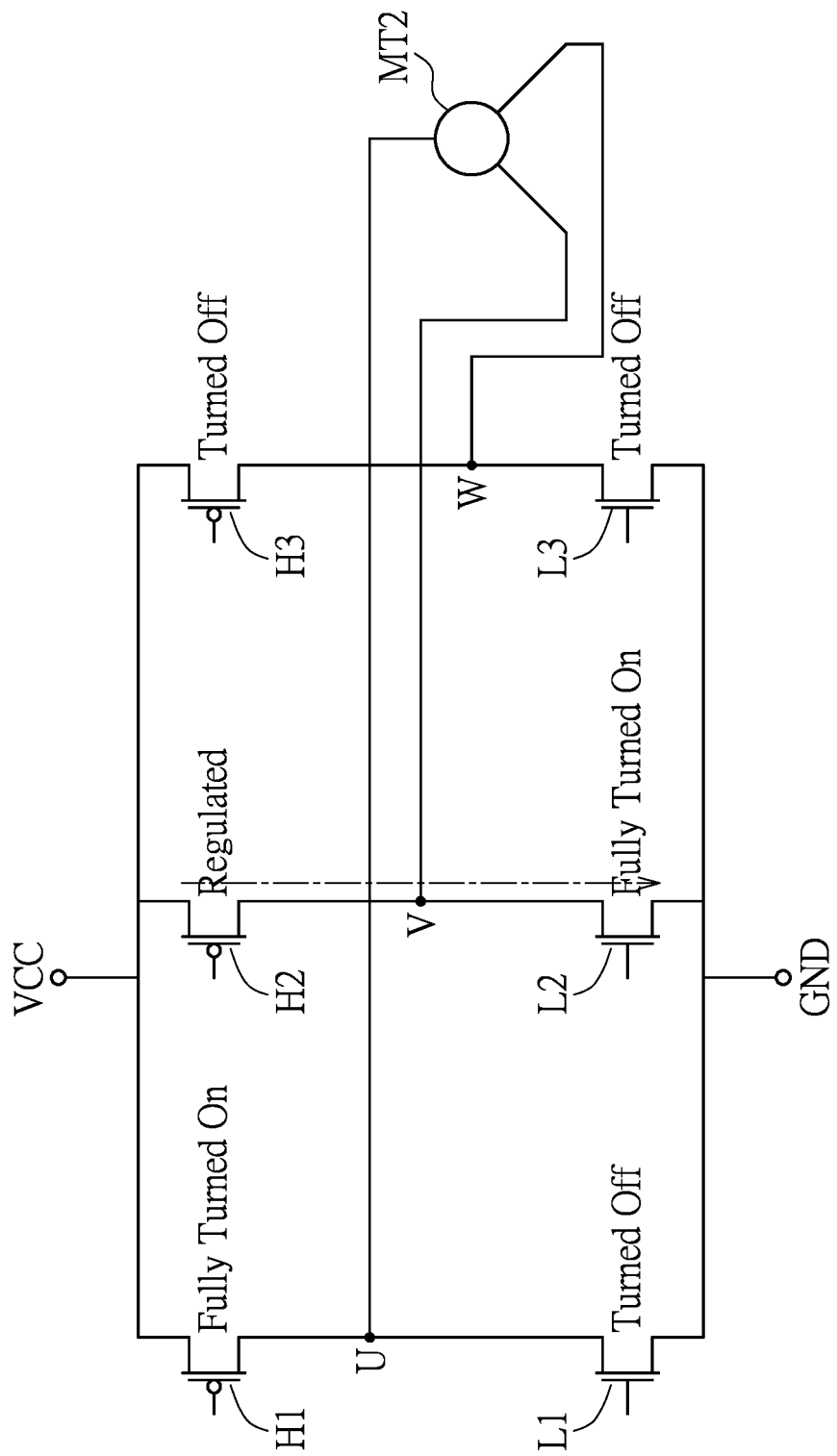
FIG. 12 is a circuit layout diagram of an output circuit of the motor protecting circuit according to the eleventh embodiment of the present disclosure.

Reference is made to FIGS. 1 and 12, in which FIG. 1 is a block diagram of a motor protecting circuit according to first to fourteen embodiments of the present disclosure, and FIG. 12 is a circuit layout diagram of an output circuit of the motor protecting circuit according to the eleventh embodiment of the present disclosure.

The motor protecting circuit of the embodiment is applied to a motor MT2 that is the three-phase motor. The output circuit 10 shown in FIG. 1 may include the first high-side transistor H1, the first low-side transistor L1, the second high-side transistor H2, the second low-side transistor L2, the third high-side transistor H3 and the third low-side transistor L3 as shown in FIG. 12.

For example, the first high-side transistor H1, the second high-side transistor H2 and the third high-side transistor H3 may be p-channel metal oxide semiconductor field effect transistors (PMOSs), and the first low-side transistor L1, the second low-side transistor L2 and the third low-side transistor L3 may be n-channel metal oxide semiconductor field effect transistors (NMOSs), but the present disclosure is not limited thereto. It should be understood that, different types of transistors may be disposed in the output circuit 10 according to actual requirements.

The first terminal of the first high-side transistor H1 is coupled to the power supply voltage VCC. The second terminal of the first high-side transistor H1 is connected to the first terminal of the first low-side transistor L1. The second terminal of the first low-side transistor L1 is grounded. The node between the second terminal of the first high-side transistor H1 and the first terminal of the second low-side transistor L2 is connected to a first terminal of a motor MT2 (that is, a U phase terminal of the motor MT2). The control terminal of the first high-side transistor H1 and the control terminal of the second low-side transistor L1 are connected to the driver circuit 20.

The first terminal of the second high-side transistor H2 is coupled to the power supply voltage VCC. The second terminal of the second high-side transistor H2 is connected to the first terminal of the second low-side transistor L2. The second terminal of the second low-side transistor L2 is grounded. The node between the second terminal of the second high-side transistor H2 and the first terminal of the second low-side transistor L2 is connected to a second terminal of the motor MT2 (that is, a V phase terminal of the motor MT2). The control terminal of the second high-side transistor H2 and the control terminal of the second low-side transistor L2 are connected to the driver circuit 20.

A first terminal of the third high-side transistor H3 is coupled to the power supply voltage VCC. A second terminal of the third high-side transistor H3 is connected to a first terminal of the third low-side transistor L3. A second terminal of the third low-side transistor L3 is grounded. A node between the second terminal of the third high-side transistor H3 and the first terminal of the third low-side transistor L3 is connected to a third terminal of the motor MT2 (that is, a W phase terminal of the motor MT2). A control terminal of the third high-side transistor H3 and a control terminal of the third low-side transistor L3 are connected to the driver circuit 20.

It is worth noting that, when the overvoltage detector circuit 40 determines that the power supply voltage VCC is higher than the voltage threshold, the controller circuit 30 may control the driver circuit 20 to fully turn on the first high-side transistor H1, to turn off the first low-side transistor L1, to regulate the second high-side transistor H2 to be slightly turned on, to fully turn on the second low-side transistor L2, and to turn off the third high-side transistor H3 and the third low-side transistor L3 at the same time, as shown in FIG. 12.

Figure 13:
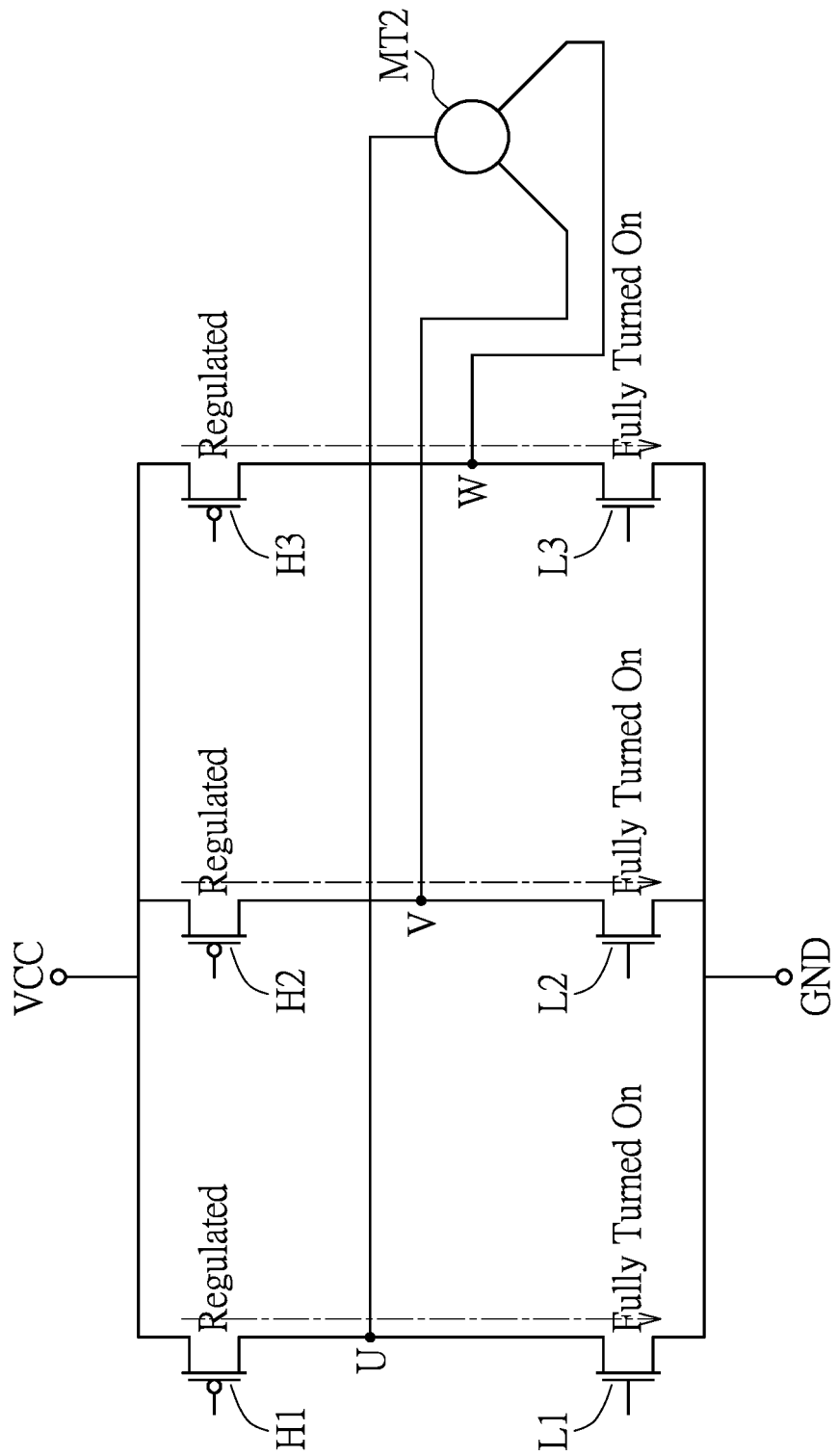
FIG. 13 is a circuit layout diagram of an output circuit of the motor protecting circuit according to the twelfth embodiment of the present disclosure.

Reference is made to FIGS. 1 and 13, in which FIG. 1 is a block diagram of a motor protecting circuit according to first to fourteen embodiments of the present disclosure, and FIG. 13 is a circuit layout diagram of an output circuit of the motor protecting circuit according to the twelfth embodiment of the present disclosure. The same descriptions are not repeated herein.

It is worth noting that, when the overvoltage detector circuit 40 determines that the power supply voltage VCC is higher than the voltage threshold, the controller circuit 30 may control the driver circuit 20 to regulate the first high-side transistor H1, the second high-side transistor H2 and the third high-side transistor H3 to be slightly turned on, and to fully turn on the first low-side transistor L1, the second low-side transistor L2 and the third low-side transistor L3 at the same time, as shown in FIG. 13.

As a result, a first current slowly flows through the first high-side transistor H1, then flows through the first low-side transistor L1, and finally flows to the ground GND. A second current slowly flows through the second high-side transistor H2, then flows through the second low-side transistor L2, and finally flows to the ground GND. A third current slowly flows through the third high-side transistor H3, then flows through the third low-side transistor L3, and finally flows to the ground GND.

Figure 14:
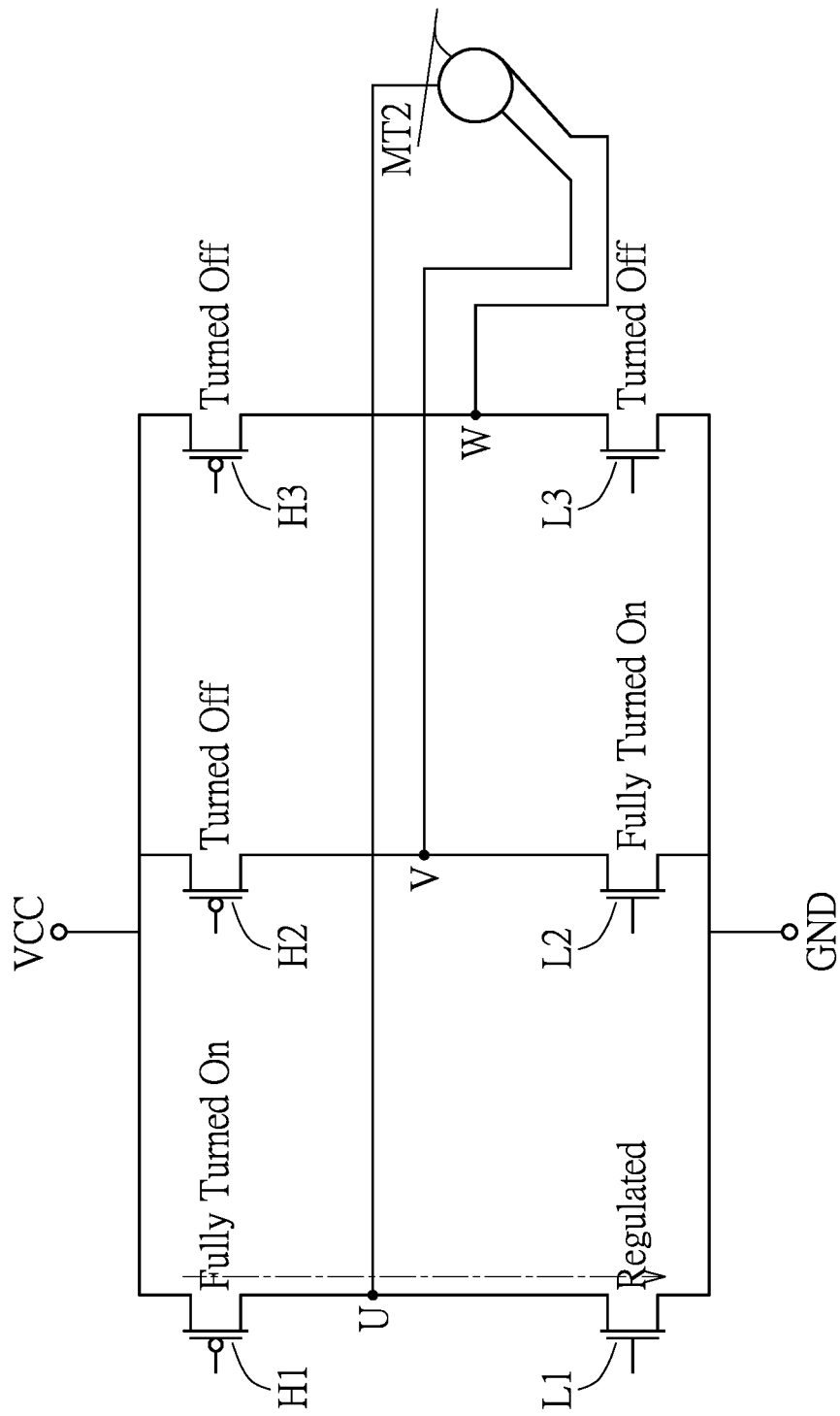
FIG. 14 is a circuit layout diagram of an output circuit of the motor protecting circuit according to the thirteenth embodiment of the present disclosure.

Reference is made to FIGS. 1 and 14, in which FIG. 1 is a block diagram of a motor protecting circuit according to first to fourteen embodiments of the present disclosure, and FIG. 14 is a circuit layout diagram of an output circuit of the motor protecting circuit according to the thirteenth embodiment of the present disclosure. The same descriptions are not repeated herein.

It is worth noting that, when the overvoltage detector circuit 40 determines that the power supply voltage VCC is higher than the voltage threshold, the controller circuit 30 may control the driver circuit 20 to fully turn on the first high-side transistor H1, regulate the first low-side transistor L1 to be slightly turned on, to turn off the second high-side transistor H2, to fully turn on the second low-side transistor L2, to turn off the third high-side transistor H3, and to turn off the third low-side transistor L3 at the same time, as shown in FIG. 14. As a result, a current flows through the first high-side transistor H1, then slowly through the first low-side transistor L1, and finally flows to the ground GND.

Figure 15:
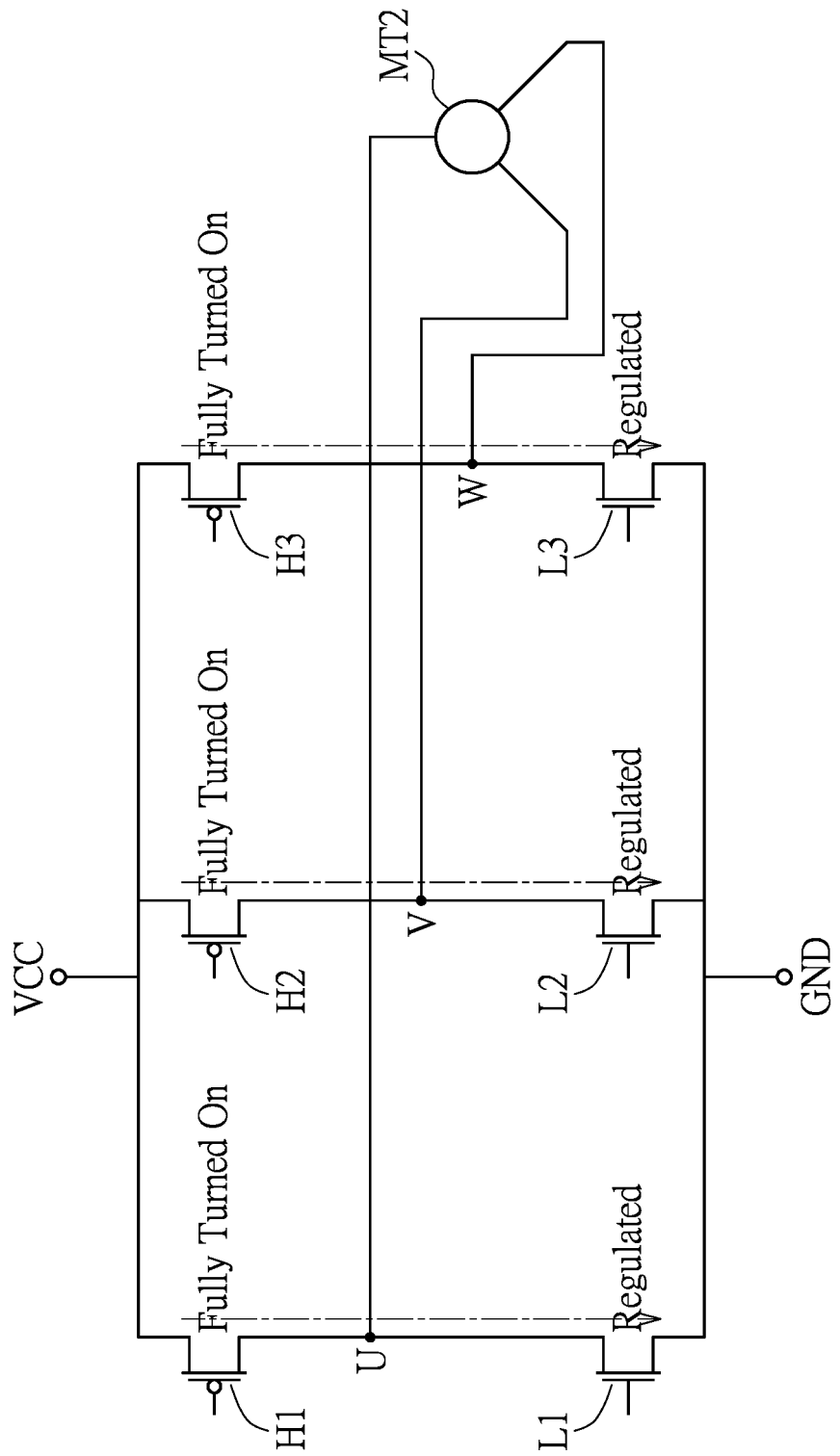
FIG. 15 is a circuit layout diagram of an output circuit of the motor protecting circuit according to the fourteenth embodiment of the present disclosure.

Reference is made to FIGS. 1 and 15, in which FIG. 1 is a block diagram of a motor protecting circuit according to first to fourteen embodiments of the present disclosure, and FIG. 15 is a circuit layout diagram of an output circuit of the motor protecting circuit according to the fourteenth embodiment of the present disclosure. The same descriptions are not repeated herein.

It is worth noting that, when the overvoltage detector circuit 40 determines that the power supply voltage VCC is higher than the voltage threshold, the controller circuit 30 may control the driver circuit 20 to regulate the first low-side transistor L1, the second low-side transistor L2 and the third low-side transistor L3 to be slightly turned on, and to fully turn on the first high-side transistor H1, the second high-side transistor H2 and the third high-side transistor H3, as shown in FIG. 15.

As a result, a first current flows through the first high-side transistor H1, then slowly flows through the first low-side transistor L1, and finally flows to the ground GND. A second current flows through the second high-side transistor H2, then slowly flows through the second low-side transistor L2, and finally flows to the ground GND. A third current flows through the third high-side transistor H3, then slowly flows through the third low-side transistor L3, and finally flows to the ground GND.

In summary, the present disclosure provides the motor protecting circuit. When the power supply voltage is higher than the voltage threshold, the high-side transistor and the low-side transistor in one of the plurality of groups or the high-side transistors and the low-side transistors in all or some of the plurality of groups are turned on. As a result, the current flows to the ground but not to the power supply voltage, thereby preventing the high-side transistors and the low-side transistors from being damaged due to overvoltage.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A motor protecting circuit, which is applicable to a motor, the motor protecting circuit comprising:
    a rotor position detector circuit disposed on the motor and configured to detect and output a rotor position of the motor;
    an output circuit including a plurality of high-side transistors and a plurality of low-side transistors that are respectively classified in a plurality of groups, wherein one of the high-side transistors and one of the low-side transistors are classified in each of the groups, a first terminal of the high-side transistor in each of the groups is coupled to a power supply voltage, a second terminal of the low-side transistor in each of the groups is grounded, a second terminal of the high-side transistor is connected to a first terminal of the low-side transistor in each of the groups, and a node between the second terminal of the high-side transistor and the first terminal of the low-side transistor in each of the groups is connected to a same terminal of the motor;
    a driver circuit connected to the output circuit, a control terminal of each of the high-side transistors, and a control terminal of each of the low-side transistors, wherein the driver circuit is configured to drive the output circuit;
    a controller circuit connected to the driver circuit and the rotor position detector circuit, and configured to control the driver circuit according to the rotor position of the motor that is detected by the rotor position detector circuit; and
    an overvoltage detector circuit connected to the controller circuit and coupled to the power supply voltage of the output circuit, wherein, when the overvoltage detector circuit determines that the power supply voltage of the output circuit is higher than a voltage threshold, the overvoltage detector circuit outputs an overvoltage detected signal to the controller circuit;
    wherein, according to the overvoltage detected signal, the controller circuit controls the driver circuit to turn on the high-side transistor and the low-side transistor in one of the plurality of groups at the same time, or to turn on the high-side transistors and the low-side transistors in some or all of the plurality of groups at the same time.

2. The motor protecting circuit according to claim 1, wherein the overvoltage detector circuit is connected to the driver circuit and configured to output the overvoltage detected signal to the driver circuit, and the driver circuit drives the output circuit according to the overvoltage detected signal.

3. The motor protecting circuit according to claim 1, wherein the overvoltage detector circuit includes an operational amplifier, a first input terminal of the operational amplifier is coupled to the power supply voltage of the output circuit, a second input terminal of the operational amplifier is coupled to a reference voltage, and the operational amplifier outputs the overvoltage detected signal according to the power supply voltage and the reference voltage.

4. The motor protecting circuit according to claim 3, wherein the overvoltage detector circuit further includes a voltage divider circuit, the voltage divider circuit is connected between the power supply voltage and the first input terminal of the operational amplifier, the voltage divider circuit divides the power supply voltage to output a divided voltage, and the operational amplifier outputs the overvoltage detected signal according to the divided voltage and the reference voltage.

5. The motor protecting circuit according to claim 1, wherein the plurality of high-side transistors include a first high-side transistor and a second high-side transistor, the plurality of low-side transistors include a first low-side transistor and a second low-side transistor, the first high-side transistor and the first low-side transistor are classified in a same one of the plurality of groups, and the second high-side transistor and the second low-side transistor are classified in a same one of the plurality of groups.

6. The motor protecting circuit according to claim 5, wherein the output circuit further includes a third high-side transistor and a third low-side transistor, and the third high-side transistor and the third low-side transistor are classified in a same one of the plurality of groups.

7. The motor protecting circuit according to claim 5, wherein, according to the overvoltage detected signal, the controller circuit controls the driver circuit to fully or slightly turn on the first high-side transistor, and to fully or slightly turn on the first low-side transistor at the same time.

8. The motor protecting circuit according to claim 7, wherein the output circuit further includes a third high-side transistor and a third low-side transistor, and the third high-side transistor and the third low-side transistor are classified in a same one of the plurality of groups.

9. The motor protecting circuit according to claim 5, wherein, according to the overvoltage detected signal, the controller circuit controls the driver circuit to fully or slightly turn on the second high-side transistor, and to fully or slightly turn on the second low-side transistor at the same time.

10. The motor protecting circuit according to claim 9, wherein the output circuit further includes a third high-side transistor and a third low-side transistor, and the third high-side transistor and the third low-side transistor are classified in a same one of the plurality of groups.

11. The motor protecting circuit according to claim 5, wherein, according to the overvoltage detected signal, the controller circuit controls the driver circuit to fully or slightly turn on the first high-side transistor and the first low-side transistor, and to fully or slightly turn on the second high-side transistor and the second low-side transistor at the same time.

12. The motor protecting circuit according to claim 11, wherein the output circuit further includes a third high-side transistor and a third low-side transistor, and the third high-side transistor and the third low-side transistor are classified in a same one of the plurality of groups.

13. The motor protecting circuit according to claim 12, wherein, according to the overvoltage detected signal, the controller circuit controls the driver circuit to fully turn on the third high-side transistor and the third low-side transistor at the same time.

14. The motor protecting circuit according to claim 12, wherein, according to the overvoltage detected signal, the controller circuit controls the driver circuit to fully turn on the third high-side transistor, and to regulate the third low-side transistor to be slightly turned on at the same time.

15. The motor protecting circuit according to claim 12, wherein, according to the overvoltage detected signal, the controller circuit controls the driver circuit to regulate the third high-side transistor to be slightly turned on, and to fully turn on the third low-side transistor at the same time.

16. The motor protecting circuit according to claim 1, wherein the motor is a single-phase motor or a three-phase motor.

* * * * *